United States Patent [19]  [11] Patent Number: 4,915,977
Okamoto et al.  [45] Date of Patent: Apr. 10, 1990

[54] METHOD OF FORMING A DIAMOND FILM

[75] Inventors: Koji Okamoto; Masayasu Tanjo; Eiji Kamijo, all of Kyoto, Japan

[73] Assignee: Nissin Electric Co., Ltd., Kyoto, Japan

[21] Appl. No.: 160,261

[22] Filed: Feb. 25, 1988

[30] Foreign Application Priority Data

Feb. 26, 1987 [JP] Japan ................... 62-43861

[51] Int. Cl.⁴ ............................................. B05D 3/06
[52] U.S. Cl. .................... 427/37; 423/446; 427/38; 427/39
[58] Field of Search ............... 423/445, 446, DIG. 10; 427/37, 34, 38, 39; 219/121.11, 121.15, 121.36, 121.38, 121.47; 204/164, 192.11, 192.12

[56]  References Cited

U.S. PATENT DOCUMENTS

| 3,961,103 | 6/1976 | Aisenberg | 427/39 |
| 4,228,142 | 10/1980 | Holcombe, Jr. et al. | 423/446 |
| 4,490,229 | 12/1984 | Mirtich et al. | 423/446 |
| 4,725,345 | 2/1988 | Sakamoto et al. | 427/39 |
| 4,767,608 | 8/1988 | Matsumoto et al. | 427/113 |

FOREIGN PATENT DOCUMENTS

| 60-118693 | 6/1985 | Japan | 423/446 |
| 60-171294 | 9/1985 | Japan | 423/446 |
| 1395648 | 5/1975 | United Kingdom | 423/442 |

Primary Examiner—Stanley Silverman
Attorney, Agent, or Firm—Finnegan, Henderson, Farabow, Garrett, & Dunner

[57] ABSTRACT

A method of forming a diamond film on a substrate wherein hydrogen, a hydrocarbon series gas, an inert gas, an organic compound series gas or a mixture of such gases is introduced into a vacuum vessel to contact a substrate and carbon is evaporated by arc discharge at a carbon cathode while applying a voltage to the substrate to deposit carbon on the substrate thus forming a diamond film on the substrate. A silicon series gas, a germanium series gas or a mixture thereof may be also introduced into the vessel with the foregoing gas or gases. While the carbon is being deposited on the substrate, thermoelectrons may also be supplied onto the substrate, and, further, high frequency discharge may be generated in a space between the substrate and the cathodes.

10 Claims, 1 Drawing Sheet

METHOD OF FORMING A DIAMOND FILM

FIELD OF INVENTION

This invention relates to a method of forming a diamond film on a substrate, and particularly to such a method wherein a gas is employed.

BACKGROUND OF THE INVENTION

Conventionally, a chemical vapor-phase epitaxy method, such as a plasma CVD method, a photo CVD method, or the like, using a gas such as a hydrocarbon gas or an organic compound series gas has been employed as a means for forming or synthesizing a diamond thin film of a substrate.

In conventional methods, however, the following problems have been observed:

(1) Simultaneously with the crystal growth of diamond, deposition of graphite is generated when using a hydrocarbon gas or an organic compound series gas;

(2) It is necessary to treat the substrate and a gas atmosphere at a high temperature (for example, about 800° C.-1000° C.), so that the material which can be used as the substrate is extremely limited; and (3) When the substrate has a large area or a complicated shape, the flow of the reaction gas tends to become uneven, so that a diamond film can not be formed uniformly on the substrate.

It is therefore an object of the present invention to provide a method of forming a diamond thin film in which the above problems in the prior art are solved.

SUMMARY OF THE INVENTION

In accordance with the present invention the objects and advantages of the pressent invention are achieved by a method comprising the steps of: introducing a first gas selected from the group consisting of hydrogen, inert gases, hydrocarbon series gases, organic compound series gases and mixtures thereof into a vacuum vessel to contact a substrate housed in the vessel, and evaporating carbon onto the substrate by arc discharge at a carbon cathode and applying a negative bias voltage to the substrate or to a holder for holding the substrate to deposit carbon on the substrate thereby forming a diamond film on a surface of the substrate.

A second embodiment of the present invention is a modification of the above method, in which a mixture of the above-described first gas with at least one of a gas of silicon series and a gas of germanium series is introduced into the vacuum vessel.

A third embodiment of the present invention is another modification of the above first method, in which an AC bias voltage is applied to the substrate or the holder.

A fourth embodiment of the present invention is a further modification of the second embodiment, in which an AC bias voltage is applied to the substrate or the holder.

DETAILED DESCRIPTION OF THE DRAWINGS

Figure 1:
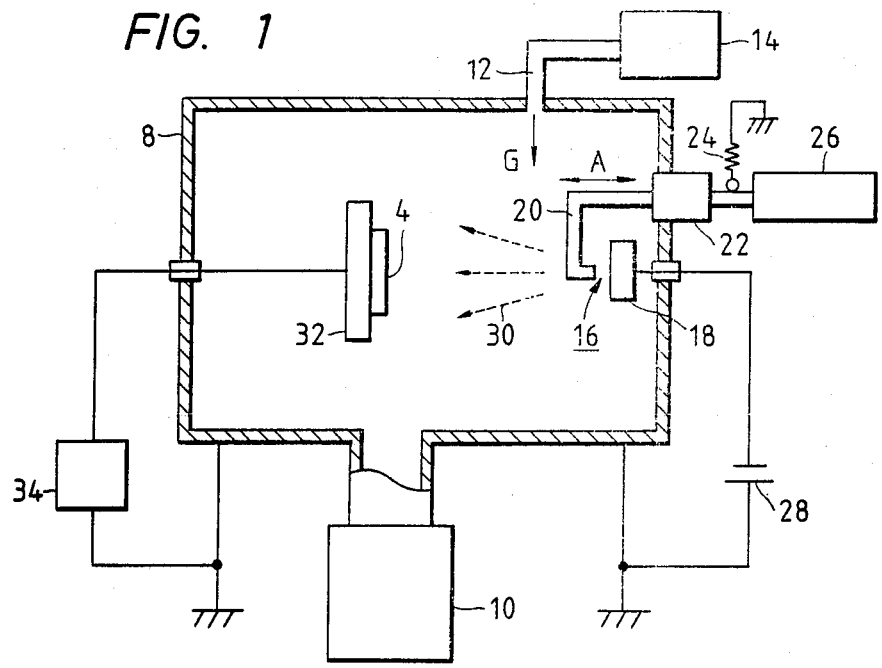
Figure 2:
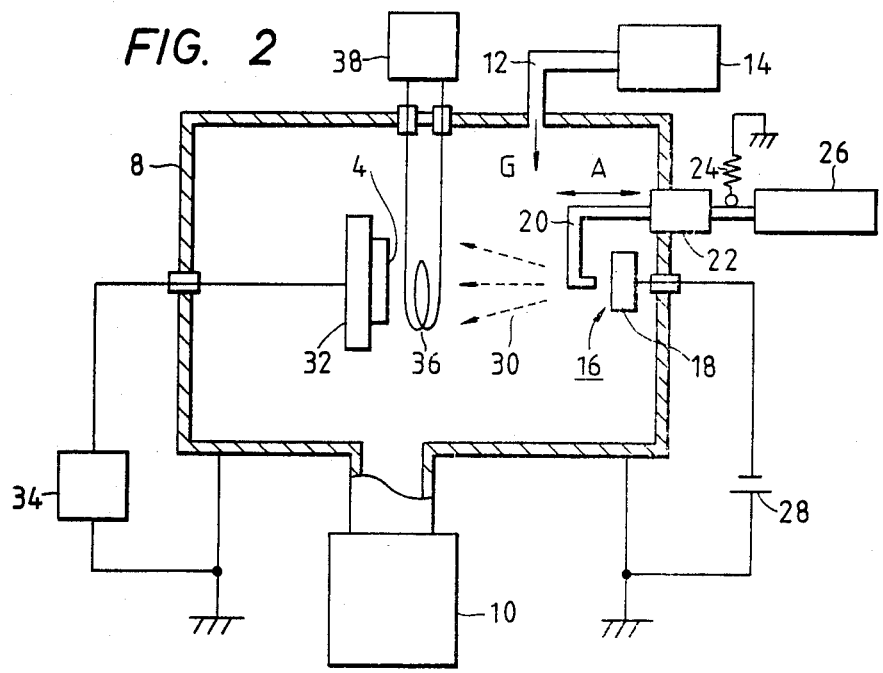

The present invention will be described by referring to the accompanying drawings wherein:

FIG. 1 is a schematic view showing an example of an apparatus by which the methods according to the present invention may be carried out; and FIG. 2 is a schematic view showing another example of another apparatus by which the methods according to the present invention can be carried out.

DESCRIPTION OF THE PREFERRED EMBODIMENTS

Preferred embodiments of the present invention will be described by reference to the operation of a preferred apparatus for carrying out the invention. FIG. 1 is a schematic view showing an embodiment of the apparatus for carrying out the method according to the present invention. In a vacuum vessel 8 which is arranged to be exhausted by a vacuum pump 10 to form a vacuum therein, a holder 32 is provided to hold a substrate (for example, a base plate) 4, and an arc evaporation source 16 is provided opposite to the substrate 4.

The arc evaporation source 16 is provided with a cathode 18 made of carbon, a trigger electrode 20 for arc ignition, and a driving device 26 constituted by, for example, an air cylinder, or the like, for reciprocally moving the trigger electrode 20 through a feedthrough 22, in the direction as shown by arrow A, from the outside of the vacuum vessel 8. An arc power source 28 for applying a voltage of, for example, about several tens volts is connected between the cathode 18 and the grounded vacuum vessel 8 so as to generate vaccum DC arc discharge between the cathode 18 and the vacuum vessel 8. The trigger electrode 20 is connected to the earth through a resistor 24.

A bias power source 34 is connected between the holder 32 and the vacuum vessel 8 so as to apply a predetermined bias volt age, described later, to the substrate 4 (or to the holder 32 in the case where the substrate 4 is an insulating material.

A selected gas G, described later, is introduced from a gas source 14 into the vacuum vessel 8 through a gas leading inlet 12 provided through a wall of the vacuum vessel 8.

In forming a film, first it is preferable to cleanse the substrate 4 so as to further improve adhesion of the diamond film onto the substrate 4. That is, the substrate 4 which has been subjected to degreasing in advance is mounted on the holder 32, the inside of the vacuum vessel is exhausted, for example, to about $10^{-5}$-$10^{-7}$ Torr, hydrogen gas or an inert gas, such as argon or the like, is introduced as the gas G into the vacuum vessel 8 so that the pressure in the vacuum vessel 8 becomes about 0.1-several Torr, and then a negative bias voltage of about $-50$--$1000$V is applied to the substrate 4 from the bias power source 34 so as to generate glow discharge around the substrate 4. Accordingly, the gas G is ionized, and ions of the gas G are drawn to the substrate 4, which has a negative potential, so as to collide with the substrate 4 to cause contaminants on the substrate 4 to spatter by the collision energy and thereby cleanse the substrate 4.

Next, the diamond film is formed. In the first embodiment according to the present invention, after the vacuum vessel 8 is exhausted again, for example, to about $10^{-5}$-$10^{-7}$ Torr, a gas which may be hydrogen, an inert gas (such as argon, neon, or the like), a hydrocarbon series gas (such as methane, ethane or the like), and a gas of an organic compound series (such as acetone, or the like), or a mixture of two or more of the foregoing gases is introduced as the gas G into the vacuum vessel 8, and the negative bias voltage is applied to the substrate 4 from the bias power source 34. Arc discharge is generated by the arc evaporation source 16, so that carbon 30 evaporated from the arc evaporation source 16 is deposited on a surface of the substrate 4.

The trigger electrode 20 is separated from the cathode 18 after the trigger electrode 20 is caused to come into contact with the cathode 18 to thereby generate initial sparks, and the arc discharge is maintained between the cathode 18 and the vacuum vessel 8, so that the cathode 18 is heated and carbon 30 evaporated from the cathode 18. The carbon 30 which is a cathode material, in the partially ionized state, is evaporated to the substrate 4 so as to deposit on the surface of the substrate 4.

The gas G is ionized by collision with the evaporated carbon ions and additionally by the glow discharge generated about the substrate 4, so that the thus produced gas ions are drawn by the substrate 4 having the negative potential so as to be caused to collide against the substrate 4.

As a result, the collision ions act as a nucleus forming energy supply source and cause the carbon to have a graphite structure, which upon being deposited on the substrate 4 grow into diamond crystals to thereby form a diamond film on the surface of the substrate 4.

The reason for the selection of the gas, or gases, described above as the gas G is that: (1) if hydrogen gas is used as the gas G, the hydrogen which has collided in the form of ions acts to remove graphite in the deposited carbon in the form of a hydrocarbon series gas such as methane, ethane or the like; (2) if a hydrocarbon series gas or a gas of an organic compound series is used as the gas G, ions of the same series as the deposited carbon, that is, carbon, collide with the deposited carbon, so that the deposited carbon is easily excited; (3) if an inert gas is used as the gas G, a high-quality diamond film containing no impurity therein can be obtained; and (4) if a mixture of the foregoing gases is used as the gas G, a combination of those actions described above can be obtained.

It is preferably to introduce the gas G into the vacuum vessel 8 so that the pressure in the vacuum vessel 8 becomes about 10 MILLI-Torr or more (but not higher than about several Torr) so that the gas G can be ionized by the collision with the evaporated carbon ions and by the glow discharge about the substrate 4.

Further, when utilizing negative bias voltage, it is preferable to select the bias voltage to be applied to the substrate 4 to have a value within a range of about $-50$ to $-1000$ V, and more preferably within a range of about $-50$ to $-600$ V. This is because if the bias voltage is lower than about $-1000$ V, the ion acceleration energy becomes so large that the ion bombardment operation also becomes large, and not only is the diamond crystal growth badly influenced, but the deposition rate of diamond film is also lowered by spattering. On the other hand, if the bias voltage is higher than about $-50$V, not only does the ion drawing operation become extremely weak, but generation of the glow discharge about the substrate 4 becomes difficult.

Further, in forming a film, as occasion demands, the substrate 4 may be heated by heating means (not shown) to about several hundred °C. so that the reaction for diamond formation can be hastened by thermal excitation.

The features of the first embodiment may be summarized as follows.

(1) The deposition of graphite can be suppressed by the energy of the collision ions, so that a uniform diamond thin film can be obtained.

(2) Because thermal excitation is not used as the main principle, low temperature treatment can be attained, so that the range of selection of the materials which can be used as the substrate 4 is extremely wide.

(3) The arc discharge at the carbon cathode 18 is used for deposition of carbon, and it is not necessary to change the state of carbon from solid to liquid to pool the same, but the carbon is directly evaporated, so that the cathode 18, that is, the arc evaporation source 16 can be disposed in any position, upper side, lower side, left side or right side, in the vacuum vessel 8, and therefore a plurality of cathodes can be provided in parallel. Accordingly, the substraate 4 can be uniformly coated with a diamond film even if the substrate 4 has a large area and/or a complicated shape.

(4) A negative bias voltage is applid to the substrate 4 so that evaporated carbon ions and gas ions are accelerated and caused to collide against the substrate 4 to thereby form a film. Accordingly, the adhesion of the formed diamond film onto the substrate 4 is good.

(5) Because carbon evaporation by arc discharge is used, the deposition rate is high in comparison with the conventional method and therefore the efficiency of diamond film formation is good.

The second embodiment according to the present invention will be described next mainly with respect to the points differing from the first embodiment. In forming a film in the second embodiment, a mixture of a first gas selected from hydrogen, inert gases, hydrocarbon series gases, gas of organic compound series or a mixture of two or more of the gases described above, and a second gas selected from silicon series gases (such as monosilane, disilane or the like) and a germanium series gas (such as germane, germanium fluoride or the like) is used as the gas G to be introduced into the vacuum vessel 8.

In that case, silicon or germanium which is ionized and rushes into the deposited film takes only an $SP^3$ bond so as to suppress the deposition of graphite and to act effectively on the diamond formation.

In that case, the mixing ratio of a gas of the silicon series and/or a gas of the germanium series to the first gas/gases does not need to be large and the ratio is sufficient if it has a value within a range of, for example, from about 0.1% to about 30% (volume %).

Accordingly, in the second embodiment, there is a further feature that a higher-quality diamond film can be formed, in addition to the above features (1) to (5) of the first embodiment.

In the first and second embodiments, when the substrate 4 is coated with a thick diamond film having a thickness of micron order, there is a possibility that the surface of the film will be charged positively (charged up) by collision ions, since a diamond film is an insulator and arc discharge is produced on the surface of the film to thereby damage the film. Accordingly, in that case, for example, as shown in FIG. 2, it is preferable to form a film while feeding thermoelectrons to the substrate 4 in such a manner, for example, that a filament 36 is provided in the vicinity of the substrate 4 and the filament 36 is heated by a power source 38 so as to emit thermoelectrons. Thus, the electrification on the film surface can be prevented by the thermoelectrons. In that case, as occasion demands, a bias for drawing the thermoelectrons may be applied between the filament 36 and the substrate 4.

In the first and second embodiments, the deposition of carbon onto the substrate 4 may be performed while high frequency discharge is being generated in a space between the substrate 4 and the cathode 18. For example, a high frequency coil is used as the member 36 in FIG. 2 in place of the filament, and high frequency power is supplied to the high frequency coil from the power source 38 so as to generate high frequency discharge about the high frequency coil. Then, ionization of the evaporated carbon 30 and the atmospheric gas G is hastened, so that more strong ion energy can be used for diamond formation or the like.

The third embodiment according to the present invention will be described next referring mainly to points different from the first embodiment. In forming a film in the third embodiment, an AC bias voltage is applied to the substrate 4 from a bias power source 34.

Then, in a negative cycle of the AC bias voltage, evaporated carbon ions and gas ions can be accelerated toward the substrate 4, so that the energy of the accelerated ions can be used as a nucleus forming energy supply source similar to the case of the first embodiment to thereby form a diamond film on the surface of the substrate 4. Further, in a positive cycle of the AC bias voltage, secondary electrons emitted from the substrate 4 or the like by ion collision are drawn back onto the substrate 4 or the like, so that the surface of the substrate 4 can be prevented from being charged up.

In that case, for the same reason as in the case of the negative DC bias voltage, it is preferable for the AC bias voltage applied to the substrate 4 to have a peak value within a range of from about 50 V to about 1000 V, more preferably within a range of from about 50 V to about 600 V.

It is not necessary to limit the waveform of the AC bias voltage to a sine wave, but the AC bias may have another waveform such as a square waveform, a saw tooth waveform, or a waveform composed of a part of a square wave.

Accordingly, the third embodiment has a further advantage that the surface of the diamond film can be prevented from being charged up even if thermoelectrons are not specially supplied to the substrate 4, in addition to the features (1) to (5) of the first embodiment.

The fourth embodiment according to the present invention will be described next mainly with respect to the difference between it and the foregoing second embodiment. In the fourth embodiment, similarly to the third embodiment, an AC bias voltage is applied to the substrate 4 from the bias power source 34 in forming a film. The operation is the same as described above.

Accordingly, the fourth embodiment has all the features of the first through third embodiments.

In the third and fourth embodiments, similar to the foregoing first and second embodiments, carbon deposition onto the substrate 4 may be performed while high frequency discharge is being generated in a space between the substrate 4 and the cathode 18. If it is desired that the electrification is more surely prevented, a film may be formed while thermoelectrons are being supplied to the substrate 4. The effects are as described above.

As desribed above, in the first embodiment according to the present invention, the following benefits can be obtained.

(1) The deposition of graphite can be suppressed, so that a uniform diamond thin film can be formed.

(2) Low temperature treatment can be attained, so that the range of selection of the materials which can be used as the substrate is extremely widened.

(3) A uniform film can be formed on a substrate even if the substrate has a large area and/or a complicated shape.

(4) The adhesion of the diamond film onto the substrate is good.

(5) The diamond film can be efficiently formed, and so on.

In the second method according to the present invention, it is possible to obtain a further benefit that a higher-quality diamond film can be formed, in addition to the foregoing benefits (1) to (5).

In the third embodiment according to the present invention, it is possible to obtain an effect that the charge-up can be prevented on the surface of the diamond film even if the thermoelectrons are not specially supplied onto the substrate, in addition to the effects (1) to (5).

In the fourth embodiment according to the present invention, it is possible to obtain the benefits that a high-quality diamond film can be formed, and that the electrification can be prevented from occurring on the surface of the diamond film even if the thermoelectrons are not specially supplied to the substrate, in addition to the foregoing benefits (1) to (5).

Having described the present invention with reference to preferred embodiments thereof, it is recognized that modifications and variations thereof falling within the spirit and scope of the invention will become apparent to those skilled in the art, an the scope of the present invention is limited only by the appended claims and equivalents thereof.

What is claimed is:

1. A method of forming a diamond film on a substrate comprising the steps of:
   introducing a gas selected from the group consisting of inert gases, hydrocarbon series gases, organic compound series gases and mixtures thereof into a vacuum vessel to contact a substrate housed in said vessel; and
   evaporating carbon onto said substrate by arc discharge at a carbon cathode housed in said vacuum vessel, while applying a negative bias voltage to said substrate or to a holder for holding said substrate to deposit carbon on said substrate thereby forming said diamond film.

2. A diamond film forming method according to claim 1, wherein carbon is deposited onto said substrate while thermoelectrons are being supplied onto said substrate.

3. A diamond film forming method according to claim 1, wherein carbon is deposited onto said substrate while high frequency discharge is being generated in a space between said substrate and said cathode.

4. A method of forming a diamond film on a substrate comprising the steps of:
   introducing a combination of (1) a gas selected from the group consisting of inert gases, hydrocarbon series gases, organic compound series gases and mixtures thereof and (b 2) a gas selected from the group consisting of silicon series gases, germanium series gases and mixtures thereof into a vacuum vessel to contact a substrate housed in said vessel; and
   evaporating carbon onto said substrate by arc discharge at a carbon cathode housed in said vacuum vessel, while applying a negative bias voltage to said substrate or to a holder for holding said substrate to deposit carbon on said substrate thereby forming said diamond film.

5. A diamond film forming method according to claim 4, wherein carbon is deposited onto said substrate while thermoelectrons are being supplied onto said substrate.

6. A diamond film forming method according to claim 4, wherein carbon is deposited onto said substrate while a high frequency discharge is being generated in a space between said substrate and said cathode.

7. A method of forming a diamond film on a substrate comprising the steps of:
 introducing a gas selected from the group consisting of inert gases, hydrocarbon series gases, organic compound series gases and mixtures thereof into a vacuum vessel to contact a substrate housed in said vessel; and
 evaporating carbon onto said substrate by arc discharge at a carbon cathode housed in said vacuum vessel, while applying an AC bias voltage to said substrate or to a holder for holding said substrate to deposit carbon on said substrate thereby forming said diamond film.

8. A diamond film forming method according to claim 7, wherein carbon is deposited onto said substrate while high frequency discharge is being generated in a space between said substrate and said cathode.

9. A method of forming a diamond film on a substrate comprising the steps of:
 introducing a combination of (1) a gas selected from the group consisting of inert gases, hydrocarbon series gases, organic compound series gases and mixtures thereof and (2) a gas selected from the group consisting of silicon series gases, germanium series gases and mixtures thereof into a vacuum vessel to contact a substrate housed in said vessel; and
 evaporating carbon onto said substrate by arc discharge at a carbon cathode housed in said vacuum vessel, while applying an AC bias voltage to said substrate or to a holder for holding said substrate to deposit carbon on said substrate thereby forming said diamond film.

10. A diamond film forming method according to claim 9, wherein carbon is deposited onto said substrate while high frequency discharge is being generated in a space between said substrate and said cathode.

* * * * *